United States Patent
Yoshihara et al.

(10) Patent No.: US 11,600,546 B2
(45) Date of Patent: Mar. 7, 2023

(54) POWER SEMICONDUCTOR APPARATUS AND METHOD FOR MANUFACTURING THE SAME

(71) Applicant: Mitsubishi Electric Corporation, Tokyo (JP)

(72) Inventors: Hiroyuki Yoshihara, Tokyo (JP); Shunji Masumori, Tokyo (JP); Kenichi Hayashi, Tokyo (JP); Masaki Goto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/621,249

(22) PCT Filed: Aug. 29, 2019

(86) PCT No.: PCT/JP2019/033921
§ 371 (c)(1),
(2) Date: Dec. 21, 2021

(87) PCT Pub. No.: WO2021/038796
PCT Pub. Date: Mar. 4, 2021

(65) Prior Publication Data
US 2022/0352049 A1    Nov. 3, 2022

(51) Int. Cl.
*H01L 23/367* (2006.01)
*H01L 21/48* (2006.01)
(Continued)

(52) U.S. Cl.
CPC ...... *H01L 23/3672* (2013.01); *H01L 21/4878* (2013.01); *H01L 23/10* (2013.01);
(Continued)

(58) Field of Classification Search
CPC ................. H01L 23/10; H01L 23/3672; H01L 23/49568; H01L 23/40; H01L 21/4878; H05K 7/2039
See application file for complete search history.

(56) References Cited

U.S. PATENT DOCUMENTS

| | | | |
|---|---|---|---|
| 8,643,171 B1 * | 2/2014 | Nakazato | H01L 21/4882 257/707 |
| 2016/0225691 A1 | 8/2016 | Sanda et al. | |
| 2016/0300785 A1 | 10/2016 | Kimura et al. | |

FOREIGN PATENT DOCUMENTS

| | | | |
|---|---|---|---|
| WO | 2015/046040 A1 | 4/2015 | |
| WO | 2015/083201 A1 | 6/2015 | |
| WO | WO-2018079396 A1 * | 5/2018 | ......... H01L 21/4882 |

OTHER PUBLICATIONS

International Search Report and Written Opinion dated Oct. 8, 2019, received for PCT Application PCT/JP2019/033921, Filed on Aug. 29, 2019, 8 pages including English Translation.
(Continued)

*Primary Examiner* — Dale E Page
*Assistant Examiner* — Abbigale A Boyle
(74) *Attorney, Agent, or Firm* — Xsensus LLP

(57) ABSTRACT

A power semiconductor apparatus includes a mold portion, a panel that is conductive and in a flat plate shape, and a plurality of fins. The mold portion includes a power semiconductor element and a base plate that are molded. An opening is formed in the panel into which the base plate is inserted. The plurality of fins is fixed in grooves of the base plate. The panel has a plurality of protrusions on side surfaces forming the opening. Each protrusion has a fifth surface a cross section of which has a shape that tapers down toward an end of the protrusion, the cross section being parallel to a plane extending in the Z direction and a direction in which the protrusion protrudes. The base plate (Continued)

has cover portions covering the fifth surfaces, and is plastically deformed to allow the panel to be fitted in the base plate to fill gaps.

21 Claims, 13 Drawing Sheets

(51) Int. Cl.
  *H05K 7/20* (2006.01)
  *H01L 23/10* (2006.01)
  *H01L 23/40* (2006.01)
  *H01L 23/495* (2006.01)
(52) U.S. Cl.
  CPC ........ *H01L 23/40* (2013.01); *H01L 23/49568* (2013.01); *H05K 7/2039* (2013.01)

(56) References Cited

OTHER PUBLICATIONS

Notification of Reasons for Refusal dated Mar. 10, 2020, received for Japanese Application 2019-566379, 4 pages including English Translation.
Decision to Grant dated May 7, 2020, received for Japanese Application 2019-566379, 5 pages including English Translation.

* cited by examiner

POWER SEMICONDUCTOR APPARATUS AND METHOD FOR MANUFACTURING THE SAME

CROSS-REFERENCE TO RELATED APPLICATION

The present application is based on PCT filing PCT/JP2019/033921, filed Aug. 29, 2019 the entire contents of which are incorporated herein by reference.

FIELD

The present invention relates to a power semiconductor apparatus and a method for manufacturing the same, the power semiconductor apparatus including a heat sink.

BACKGROUND

Conventionally, there has been proposed a power semiconductor apparatus having a structure in which fins are fixed to a base plate having good thermal conductivity so as to cool a power semiconductor element that generates a large amount of heat. Such a power semiconductor apparatus has a structure in which a base plate is inserted into an opening in a panel made of a plate-shape conductive material such that the panel is sandwiched and fixed between the base plate and the fins.

Patent Literature 1 discloses a power semiconductor apparatus in which a protrusion is provided on a side surface of a panel in which an opening is formed. In the power semiconductor apparatus disclosed in Patent Literature 1, the protrusion is press-fitted into a base plate when the base plate is inserted into the opening in the panel. That is, in the power semiconductor apparatus disclosed in Patent Literature 1, the base plate is plastically deformed to cause the protrusion to dig into the base plate. As a result, in the power semiconductor apparatus disclosed in Patent Literature 1, the panel is held by the frictional force of a contact interface between a side surface of the protrusion and the base plate so that the panel does not fall off the base plate.

Patent Literature 2 discloses a power semiconductor apparatus in which a positioning portion that has a recessed shape and is used for positioning a panel is provided in an outer peripheral surface of a base plate. In the power semiconductor apparatus disclosed in Patent Literature 2, a protrusion is provided on the base plate on the inner side of the positioning portion. The protrusion has an upper surface that is located at a position lower than an upper surface of the base plate. In addition, in the power semiconductor apparatus disclosed in Patent Literature 2, a positioning portion formed as a protrusion is provided at a position corresponding to a positioning portion provided on a surface of the panel that forms an opening. In the power semiconductor apparatus disclosed in Patent Literature 2, the base plate is inserted into the opening in the panel in a state where the positioning portion of the base plate and the positioning portion of the panel are aligned, and a load perpendicular to the panel is applied only to the protrusions to plastically deform the protrusions. As a result, in the power semiconductor apparatus disclosed in Patent Literature 2, material forming the plastically deformed protrusions spreads between the positioning portion of the base plate and the positioning portion of the panel, and comes into close contact with the panel, so that the panel is fixed to the base plate.

CITATION LIST

Patent Literature

Patent Literature 1: WO 2015/046040 A
Patent Literature 2: WO 2015/083201 A

SUMMARY

Technical Problem

However, the technique of Patent Literature 1 described above has a problem in that if the side surface of the protrusion of the panel is uneven, a gap is generated between the side surface of the protrusion and the base plate when the protrusion is press-fitted into the base plate. This reduces the area of contact between the base plate and the side surface of the protrusion, which makes the panel likely to fall off the base plate. In addition, according to the technique of Patent Literature 2 described above, the base plate is processed to form the protrusion. This makes the processing process complicated and increases processing cost.

The present invention has been made in view of the above, and an object of the present invention is to obtain a power semiconductor apparatus capable of making a panel less likely to fall off a base plate and simplifying a processing process.

Solution to Problem

A power semiconductor apparatus according to an aspect of the present invention includes: a mold portion, a panel that is conductive and has a flat plate shape, and a plurality of fins. The mold portion includes a power semiconductor element and a base plate which are molded in molding resin, the base plate having a first surface and a second surface, a plurality of grooves being arranged on the first surface, the second surface being on a side opposite to the first surface in a Z direction perpendicular to the first surface. The panel has an opening into which the first surface of the base plate is inserted, the panel having a third surface and a fourth surface that is on a side opposite to the third surface. The plurality of fins are fixed in the grooves of the base plate. The panel has a plurality of protrusions on side surfaces forming the opening, each protrusion protruding, from one of the side surfaces on which the protrusion is provided, toward another of the side surfaces facing the one side surface. Each protrusion has a fifth surface, a cross section of which has a shape that tapers down toward an end of the protrusion, the cross section being parallel to a plane extending in the Z direction and a direction in which the protrusion protrudes. The base plate has cover portions covering the fifth surfaces of the plurality of protrusions including the ends of the protrusions, and is plastically deformed to allow the panel to be fitted in the base plate to fill gaps between side surfaces of the plurality of protrusions and the base plate.

Advantageous Effects of Invention

The power semiconductor apparatus according to the present invention has the effect of capable of making the panel less likely to fall off the base plate and simplifying a processing process.

DESCRIPTION OF EMBODIMENTS

Hereinafter, a power semiconductor apparatus and a method for manufacturing the same, according to each embodiment of the present invention will be described in detail with reference to the drawings. Note that the present invention is not limited to the embodiments.

First Embodiment.

Figure 1:
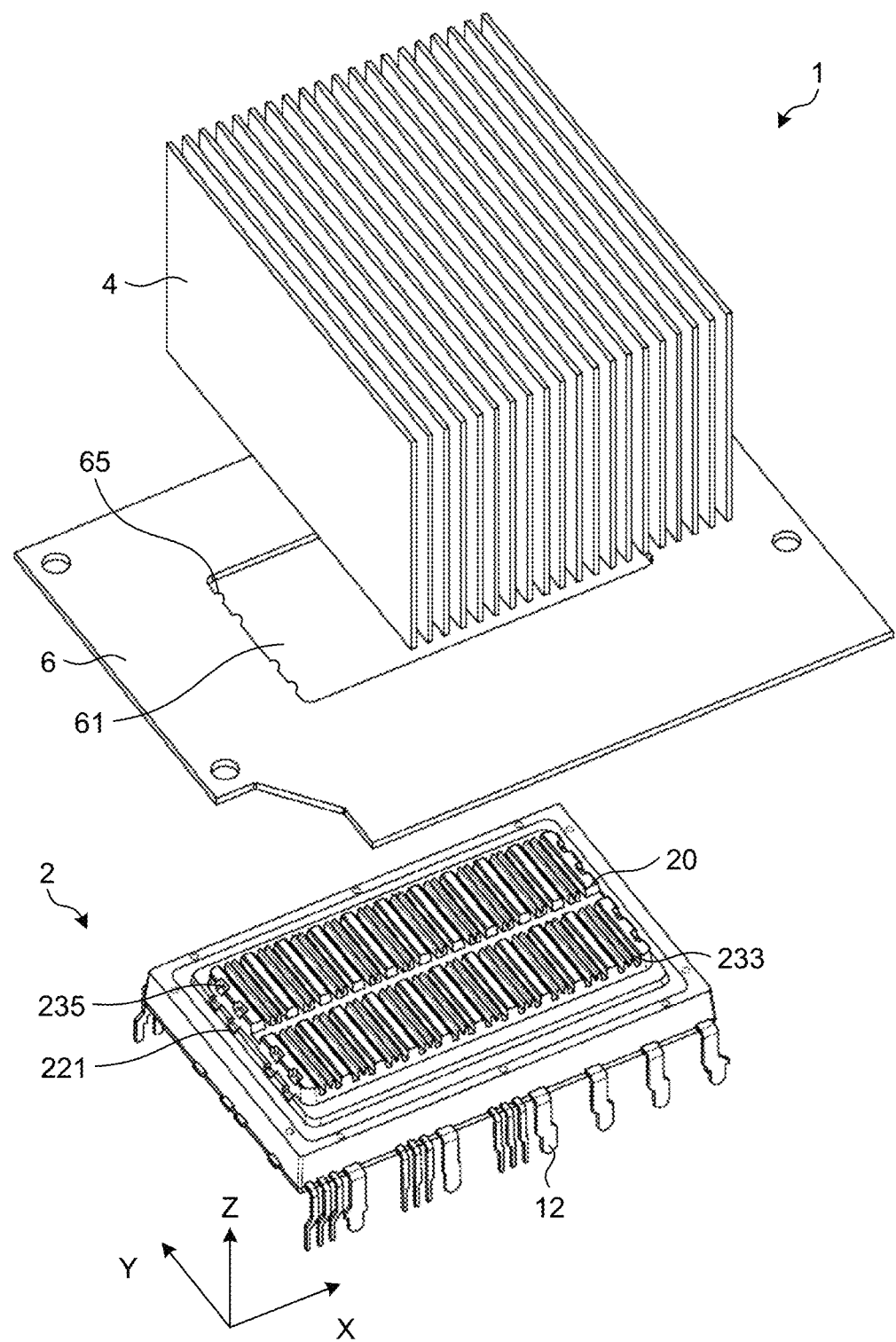
FIG. 1 is an exploded perspective view of a power semiconductor apparatus according to a first embodiment, which shows a configuration example of the power semiconductor apparatus.

FIG. 1 is an exploded perspective view of a power semiconductor apparatus according to a first embodiment, which shows a configuration example of the power semiconductor apparatus. Note that, in the following description, a direction in which fins 4 are arranged is defined as an upward direction, and a direction opposite to the upward direction is defined as a downward direction for a power semiconductor apparatus 1 and members included in the power semiconductor apparatus 1. The terms "upward direction" and "downward direction" are used for convenience, and do not mean the actual "upward direction" and "downward direction", respectively. Thus, these directions may be reverse. The power semiconductor apparatus 1 includes a mold portion 2, a plurality of the fins 4, and a panel 6.

The mold portion 2 includes a lead frame 12 and a base plate 20 molded in molding resin. The lead frame 12 is joined to a power semiconductor element (not illustrated). The base plate 20 has fin insertion grooves 233 on its upper surface defined as a first surface. The fins 4 are inserted into the fin insertion grooves 233. On the upper surface of the base plate 20, a direction in which the fin insertion grooves 233 extend is defined as a Y direction, and a direction perpendicular to the Y direction is defined as an X direction. Furthermore, a direction perpendicular to both the X direction and the Y direction is defined as a Z direction. The fin insertion grooves 233 are arranged at intervals in the X direction.

The fins 4 are thin plate-shape members in a rectangular shape. The fins 4 are made of a metal material having high thermal conductivity so that heat generated in the power semiconductor element to be described below can be dissipated. In one example, the fins 4 are made of aluminum or copper. The fins 4 are inserted into the fin insertion grooves 233 of the base plate 20 and crimped to be fixed to the base plate 20. The fins 4 are disposed such that the panel 6 is sandwiched between the fins 4 and the base plate 20. In the Y direction, the length of each fin 4 is formed longer than the length of the base plate 20. Accordingly, heat dissipation is improved in the power semiconductor apparatus 1.

The panel 6 is a flat plate-shape member having an upper surface and a lower surface. The upper surface is defined as a third surface. The lower surface on a side opposite to the upper surface is defined as a fourth surface. The panel 6 is made of a conductive metal material that is harder than the material of the base plate 20. The panel 6 is made of material which is hardly corroded such as a stainless steel plate or a galvanized steel plate. In particular, galvanized steel plates are less expensive than stainless steel plates, and are therefore suitable for use as materials. The panel 6 has an opening 61 into which an upper portion of the base plate 20 can be inserted. The fins 4 are fixed to the base plate 20 with the upper portion of the base plate 20 inserted into the opening 61 in the panel 6. It is desirable that the length of the panel 6 be equal to or greater than the length of the fin 4 in the Y direction. Even when the fin 4 is larger in length in the Y direction than the base plate 20, it is possible to form a linear air passage in each area between the fins 4 adjacent to each other in the X direction when the panel 6 is provided.

Figure 2:
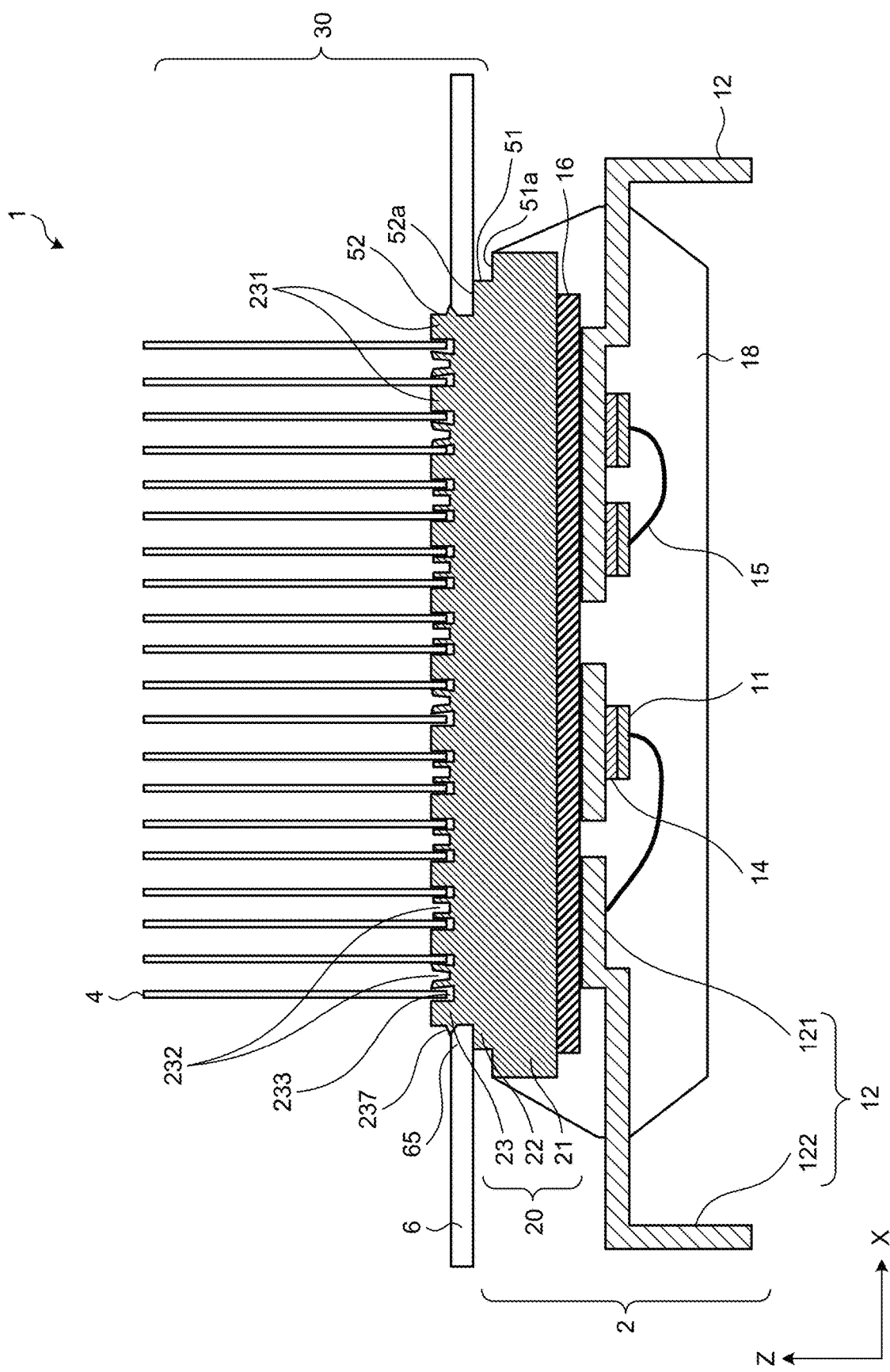
FIG. 2 is a cross-sectional view of the power semiconductor apparatus according to the first embodiment, which schematically shows the configuration example of the power semiconductor apparatus.
Figure 3:
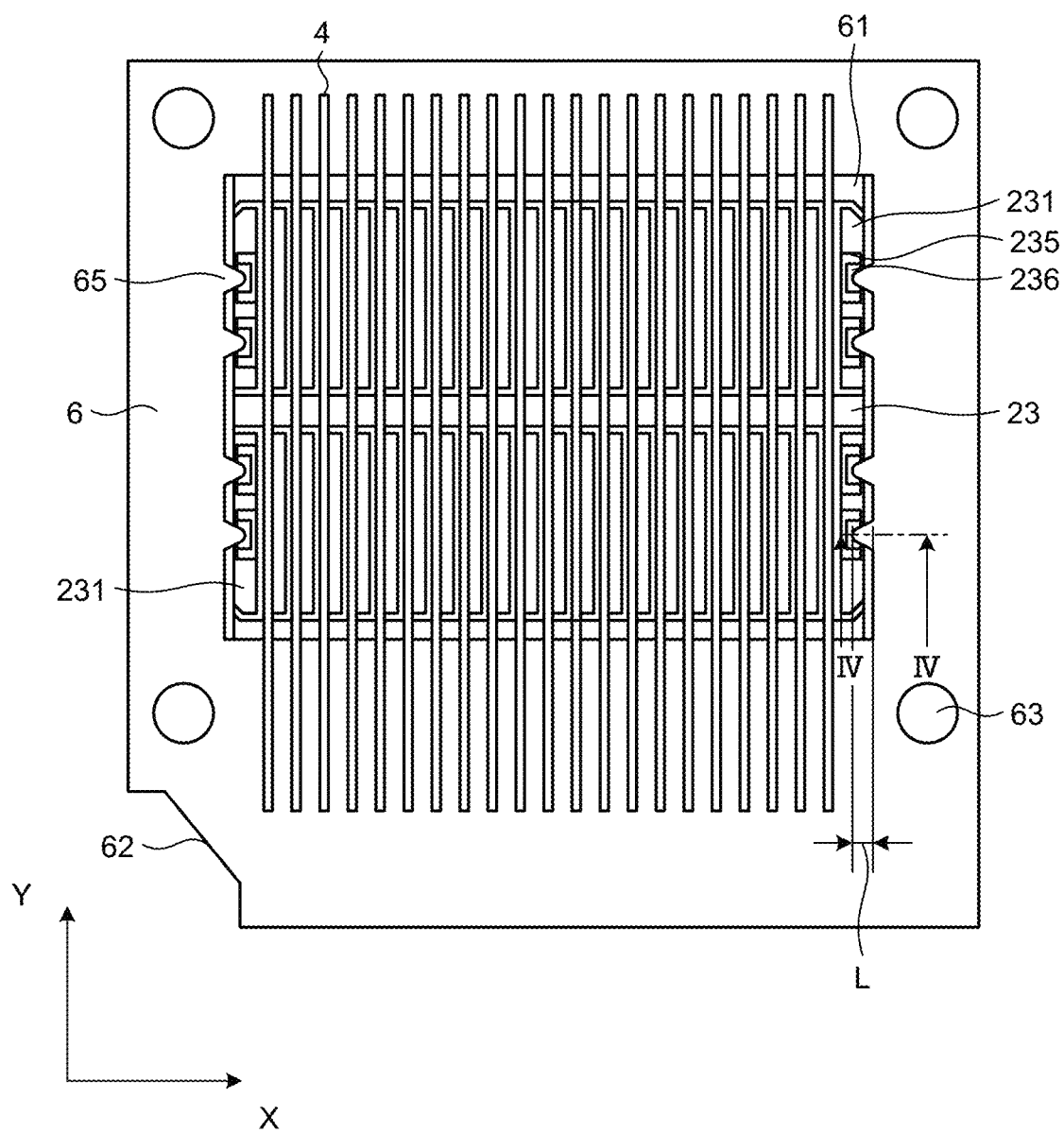
FIG. 3 is a top view of the power semiconductor apparatus according to the first embodiment, which schematically shows the configuration example of the power semiconductor apparatus.

FIG. 2 is a cross-sectional view of the power semiconductor apparatus according to the first embodiment, which schematically shows the configuration example of the power semiconductor apparatus. FIG. 3 is a top view of the power semiconductor apparatus according to the first embodiment, which schematically shows the configuration example of the power semiconductor apparatus. The mold portion 2 includes power semiconductor elements 11, the lead frame 12, and the base plate 20.

The power semiconductor elements 11 are semiconductor elements for power control. Examples of the power semiconductor elements 11 include a rectifier diode, a power transistor, a thyristor, and an insulated gate bipolar transistor (IGBT). The power semiconductor elements 11 are elements formed of silicon (Si), or elements formed of wide band gap semiconductors larger in band gap than silicon. Examples of the wide band gap semiconductors include silicon carbide (SiC), a gallium nitride-based material, and diamond. The power semiconductor elements 11 using wide band gap semiconductors have a high allowable current density and a low power loss. This enables the power semiconductor apparatus 1 to be downsized.

The lead frame 12 includes element mounting portions 121 and terminal portions 122. An element is mounted on the element mounting portion 121. The terminal portion 122 is drawn out as a connection terminal. The power semiconductor elements 11 are disposed on lower surfaces of the element mounting portions 121 via conductive members 14. Examples of the conductive member 14 include solder and silver paste. In addition, the power semiconductor element 11 and another power semiconductor element 11, or the power semiconductor element 11 and the lead frame 12 are electrically connected by a connecting member 15. Examples of the connecting member 15 include aluminum and copper.

The base plate 20 is a member that transfers heat from the power semiconductor elements 11 to the fins 4. The base plate 20 has a rectangular shape in a plan view. The base plate 20 is made of a metal material having high thermal conductivity, and being softer than the panel 6.

The base plate 20 is made of a metal material that is easy to plastically deform when the panel 6 is crimped. The base plate 20 is made of, for example, aluminum or copper.

A stepped structure is provided on an upper side surface of the base plate 20. That is, the base plate 20 includes a first base 21, a second base 22, and a fin fixing portion 23. The first base 21 is located on a lower surface side, the lower surface being defined as a second surface. The second base 22 is disposed on the first base 21. The fin fixing portion 23 is disposed on the second base 22.

A lower surface of the first base 21 of the base plate 20 is joined to the element mounting portions 121 of the lead frame 12 via an insulating member 16. The insulating member 16 is made of an insulating material having high thermal conductivity. Examples of the insulating member 16 include an insulating sheet, an insulating substrate, and an insulating film. Epoxy resin containing filler having high thermal conductivity can be used as the insulating member 16.

A stepped surface of a first step portion 51 provided on the first base 21 serves as an outer peripheral surface of the second base 22. A flat portion 51a of the first step portion 51 serves as an upper surface of the first base 21. That is, the second base 22 has a rectangular shape smaller than the first base 21 in a plan view, so that an upper surface of a periphery of the first base 21 is exposed as the flat portion 51a.

A stepped surface of a second step portion 52 provided on the second base 22 serves as an outer peripheral surface of the fin fixing portion 23. The fin fixing portion 23 has a rectangular shape smaller than the second base 22 in a plan view. A flat portion of the second step portion 52, that is, an upper surface exposed at a periphery of the second base 22 serves as a panel installation surface 52a on which the panel 6 is placed.

Protruding wall portions 231 extending in the Y direction and crimp portions 232 extending in the Y direction are alternately provided in the X direction on an upper surface of the fin fixing portion 23. The protruding wall portion 231 has a function of supporting one surface of each lower portion of the fins 4. The protruding wall portions 231 are provided at predetermined intervals in the X direction. The crimp portion 232 is provided between the two protruding wall portions 231 adjacent in the X direction. An upper end of the crimp portion 232 has a bifurcated shape, and supports one surface of each lower portion of the fins 4 adjacent in the X direction. The protruding wall portion 231 and the crimp portion 232 are divided by a groove extending in the Y direction. This groove serves as the fin insertion groove 233. Note that the protruding wall portions 231 are disposed at both ends in the X direction.

As illustrated in FIGS. 1 and 3, each of the protruding wall portions 231 disposed at both ends in the X direction has a protrusion placement portion 235 which is a recess formed as a result of cutting out a part of the protruding wall portion 231. In one example, each of the two protruding wall portions 231 disposed at both ends in the X direction has four protrusion placement portions 235. The protrusion placement portion 235 has a function of supporting a protrusion 65 of the panel 6 before the panel 6 is crimped onto the base plate 20. The protrusion 65 will be described below. In addition, the second base 22 has waste clearance grooves 221 provided on the stepped surfaces perpendicular to the X direction. Each waste clearance groove 221 is provided at a position corresponding to the protrusion placement portion 235. The waste clearance groove 221 is a groove for letting out waste of the base plate 20 discharged when the panel 6 is crimped onto the base plate 20.

As illustrated in FIG. 2, the base plate 20, the lead frame 12, and the power semiconductor elements 11 are integrally molded in molding resin 18 to form the mold portion 2. The lead frame 12 is joined to the lower surface of the base plate 20 via the insulating member 16. The power semiconductor elements 11 are joined to the element mounting portions 121 of the lead frame 12. Note that the panel installation surface 52a is provided at a position higher than an upper surface of the molding resin 18. As a result, even when burrs of the molding resin 18 are generated, the molding resin 18 does not get under the panel 6. Therefore, the panel 6 does not tilt with respect to the upper surface of the base plate 20, so that the panel 6 and the base plate 20 can be kept parallel to each other.

As illustrated in FIG. 3, the panel 6 is a rectangular plate-shape member having the opening 61, but a cutout 62 is provided in one corner of the panel 6. The cutout 62 serves as a mark indicating a direction in which the panel 6 is set. The opening 61 has a rectangular shape in a plan view. The opening 61 has a sufficient size to allow insertion of the fin fixing portion 23 of the base plate 20. The panel 6 has the protrusion 65 on one side surface that protrudes toward another side surface facing the one side surface, the side surfaces forming the opening 61. The protrusion 65 has an upper surface defined as a fifth surface, which has a shape that, in a cross section of the protrusion 65 parallel to a plane extending in the Z direction and a direction in which the protrusion 65 protrudes, tapers down toward the end of the protrusion 65. In one example, the protrusion 65 has a triangular shape that tapers down from a connecting portion 65a, at which the protrusion 65 is connected with the panel 6, to the end in a plan view. In the example of FIG. 3, four protrusions 65 are provided on each of two edges parallel to the Y direction. When the fin fixing portion 23 is inserted into the opening 61 in the panel 6, the positions of the protrusions 65 correspond to the positions of the protrusion placement portions 235 provided in the fin fixing portion 23 of the base plate 20. That is, the fin fixing portion 23 of the base plate 20 is inserted into the opening 61 in the panel 6 such that the positions of the protrusions 65 of the panel 6 are aligned with the positions of the protrusion placement portions 235 of the base plate 20. Furthermore, the protrusions 65 of the panel 6 and the base plate 20 around the protrusions 65 are pressurized from above such that the lower surface of the panel 6 comes in contact with the panel installation surface 52a of the base plate 20. As a result, the panel 6 is fixed to the base plate 20. The panel 6 has four screw holes 63 in the periphery. The screw holes 63 are provided so as to screw the panel 6 to a housing of an apparatus in which the power semiconductor apparatus 1 is provided.

Figure 4:
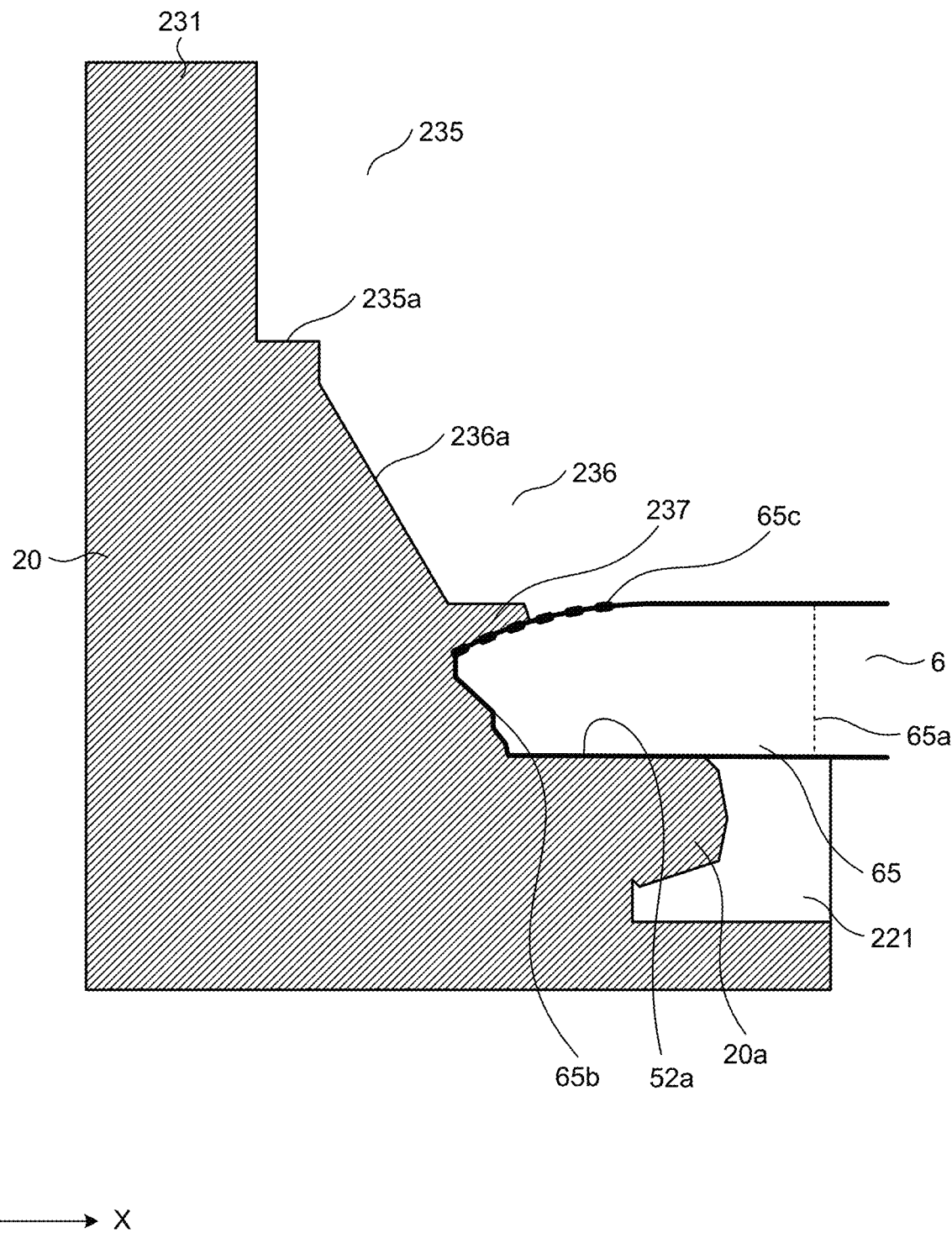
FIG. 4 is a cross-sectional view taken along line IV-IV in FIG. 3, which schematically illustrates a state of joining a base plate and a panel according to the first embodiment.

FIG. 4 is a cross-sectional view taken along line IV-IV in FIG. 3, which schematically illustrates a state of joining the base plate and the panel according to the first embodiment. The panel 6 can be produced by etching or cutting. However, it is expensive to produce the panel 6 by etching or cutting. Therefore, the panel 6 is generally produced by punching that is less expensive. The punching is performed by use of a punching die that forms the shape of the panel 6 in a manner in which a member is sheared by a punch. Therefore, a curved surface called a shear droop surface is formed on the upper surface of the panel 6, and a burr surface is formed on the lower surface of the panel 6 in a case where the panel 6 is produced by punching. Furthermore, in general, a side surface of the panel 6 is formed as an uneven surface instead of an even surface.

Therefore, as illustrated in FIGS. 2 and 4, an upper surface of the end portion of the protrusion 65 is a curved surface 65c in a side view, and the position of the upper surface of the protrusion 65 in the Z direction is lower at its end than at the connecting portion 65a. That is, the end of the upper surface of the protrusion 65, which is the fifth surface, is located on the lower surface side of the panel 6 with respect to the position of the upper surface of the panel 6 in the Z direction. Furthermore, a lower surface of the protrusion 65, which is defined as a sixth surface, is located at the same level as the lower surface of the panel 6. In a state where the panel 6 is joined to the base plate 20, a side surface 65b positioned on the opening 61 side of the protrusion 65 is brought into contact with the base plate 20 in such a way as to reduce a gap between the side surface 65b and the base plate 20 as far as possible, and a part of the curved surface 65c of the end portion of the protrusion 65 is covered with a cover portion 237 that is a constituent member of the base plate 20. Thus, the cover portion 237 covers the part of the curved surface 65c of the end portion of the protrusion 65, and a gap that may be caused between the side surface 65b of the protrusion 65 and the base plate 20 will be reduced. As a result, fixing strength between the panel 6 and the base plate 20 is improved, so that the panel 6 is less likely to be detached from the base plate 20. In addition, even if the side surface 65b of the protrusion 65 is an uneven surface, the side surface 65b of the panel 6 need not be additionally processed. As a result, the panel 6 that is inexpensive can be used.

As illustrated in FIGS. 3 and 4, in a state where the panel 6 is fixed, the protruding wall portion 231 has a recess 236 obtained as a result of partially removing a bottom surface 235a of the protrusion placement portion 235. The recess 236 is provided between the bottom surface 235a of the protrusion placement portion 235 and the cover portion 237. As will be described in a manufacturing method set forth below, the recess 236 is formed by the outer shape of a jig when the protrusion 65 of the panel 6 and the protrusion placement portion 235 are simultaneously pressurized by the jig. The recess 236 has a tapered surface 236a inclined toward a periphery of the base plate 20.

The recess 236 is larger than the protrusion 65 in the XY-plane. In the XY-plane, the recess 236 may be in a rectangular shape, a perfect circular shape, or an elliptical shape. Alternatively, the recess 236 may be in a triangular shape as with the protrusion 65.

Furthermore, in a case where the thickness of the panel 6 is 1.0 mm or more and 2.0 mm or less, the protrusion 65 has a length L of 0.5 mm or more and 0.9 mm or less in the X direction. Thus, the length L of the protrusion 65 is desirably smaller than the thickness of the panel 6. It is possible to increase an area for fixing the fins 4 to the base plate 20 by reducing the length L of the protrusion 65. As a result, the heat dissipation performance of the power semiconductor apparatus 1 can be improved. In addition, it is possible to reduce a pressing load to be applied at the time of pressing the protrusion 65 by reducing the length L of the protrusion 65, so that the power semiconductor apparatus 1 can be easily manufactured.

As illustrated in FIGS. 2 and 4, the lower surface of the panel 6 comes into contact with the panel installation surface 52a of the panel 6. The protrusion 65 comes into contact with the base plate 20 to be electrically continuous, and functions to ground the power semiconductor apparatus 1.

Note that as illustrated in FIG. 2, the plurality of fins 4, the panel 6, and the base plate 20 form a crimped heat sink 30.

Next, a description will be given of a method for manufacturing the power semiconductor apparatus 1 having such a structure. FIGS. 5 to 9 are cross-sectional views of the power semiconductor apparatus according to the first embodiment, which schematically show an example of a procedure for a method for manufacturing the power semiconductor apparatus. Note that FIGS. 5 to 7 correspond to cross-sectional views taken along line IV-IV in FIG. 3, and FIGS. 8 and 9 correspond to cross-sectional views of the base plate and the panel. Note that, in the following description, a direction in which fins 4 are arranged is defined as an upward direction, and a direction opposite to the upward direction is defined as a downward direction for a power semiconductor apparatus 1 and members included in the power semiconductor apparatus 1. The terms "upward direction" and "downward direction" are used for convenience, and do not mean the actual "upward direction" and "downward direction", respectively. Thus, these directions may be reverse.

First, the power semiconductor elements 11 are joined to the lower surfaces of the element mounting portions 121 of the lead frame 12 via the conductive members 14. Then, the base plate 20 is disposed, via the insulating member 16, on an upper surface side of the element mounting portions 121 of the lead frame 12 to which the power semiconductor elements 11 have been joined, and the mold portion 2 molded in the molding resin 18 is formed.

Figure 5:
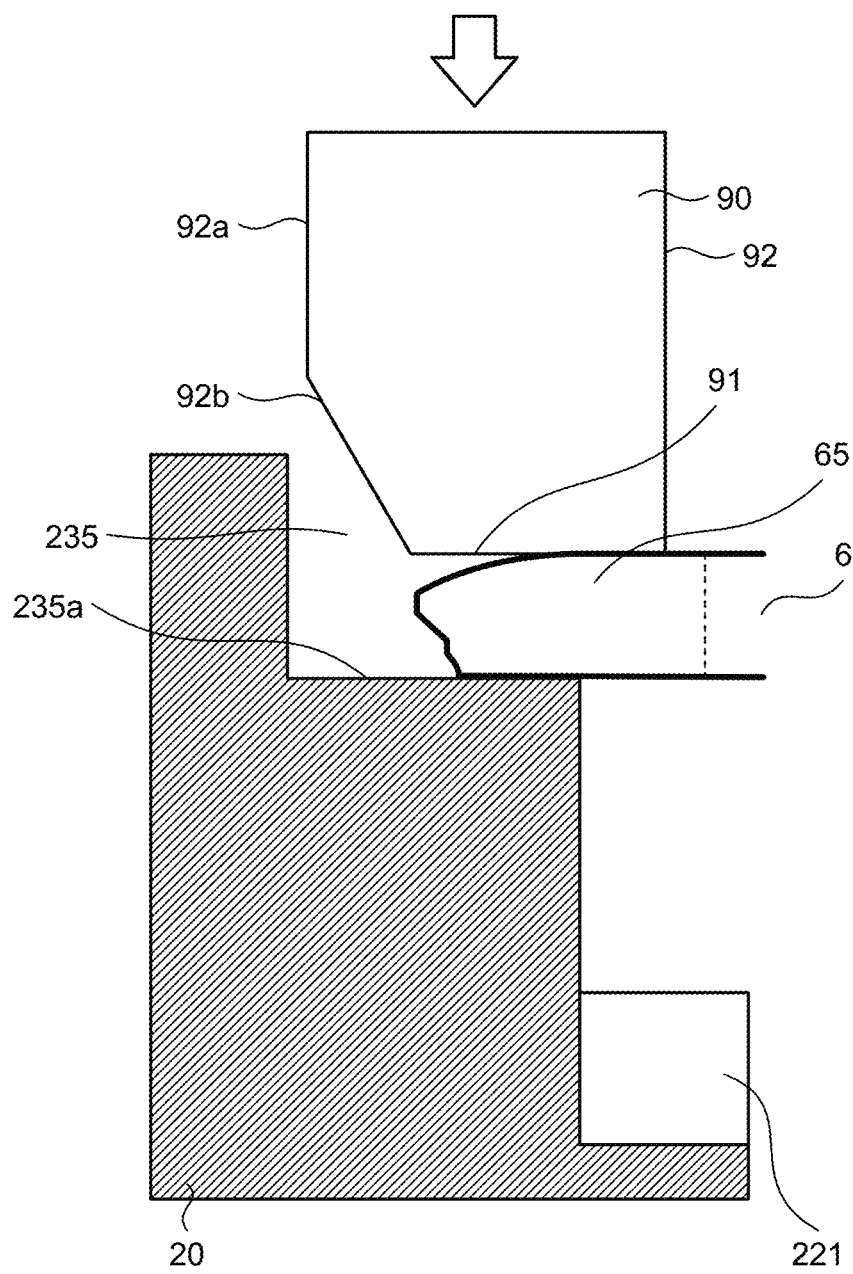
FIG. 5 is a cross-sectional view of the power semiconductor apparatus according to the first embodiment, which schematically shows an example of a procedure for a method for manufacturing the power semiconductor apparatus.

Next, after steps such as a lead forming step of forming the lead frame 12 protruding from the mold portion 2 into an appropriate shape are performed, the panel 6 is crimped onto the base plate 20 by panel crimping. Here, the fin fixing portion 23 of the base plate 20 is inserted into the opening 61 in the panel 6. At this time, the base plate 20 is inserted into the panel 6 with the positions of the protrusions 65 of the panel 6 aligned with the positions of the protrusion placement portions 235 of the base plate 20 as illustrated in FIG. 5. As a result, the lower surface of each protrusion 65, which is the sixth surface, comes into contact with the bottom surface 235a of the protrusion placement portion 235, so that the panel 6 is supported by the protrusions 65 placed on the fin fixing portion 23.

Thereafter, a panel protrusion pressurizing portion 90 that is a jig is pressed against the upper surfaces of the protrusions 65. Then, all the protrusions 65 are simultaneously pressed downward by use of the panel protrusion pressurizing portion 90. A lower surface 91 of the panel protrusion pressurizing portion 90 is parallel to the upper surface or the lower surface of the base plate 20. The lower surface 91 of the panel protrusion pressurizing portion 90 is larger in size than the protrusion 65 in the XY-plane. As a result, when the upper surface of the protrusion 65 is located at the same level as or lower than the bottom surface 235a of the protrusion placement portion 235, the base plate 20 around the protrusion 65 can also be pressed simultaneously with the protrusion 65. Here, the base plate 20 around the protrusion 65 refers to a part of the base plate 20 with which the panel protrusion pressurizing portion 90 comes into contact when the upper surface of the protrusion 65 is located at the same level as or lower than the bottom surface 235a of the protrusion placement portion 235.

In the process of the pressing performed by the panel protrusion pressurizing portion 90, only the protrusion 65 is initially pressed by the panel protrusion pressurizing portion 90. However, when the upper surface of the protrusion 65 is located at the same level as or lower than the bottom surface 235a of the protrusion placement portion 235 during crimping, the panel protrusion pressurizing portion 90 simultaneously presses the protrusion 65 and the base plate 20 while moving downward. At this time, a part of the base plate 20 forming the protrusion placement portion 235 is plastically deformed while being pressed by the panel protrusion pressurizing portion 90. Specifically, the part of the base plate 20 pressed by the panel protrusion pressurizing portion 90 is deformed in the direction of arrows E and moves in such a way as to fill a space between the side surface of the base plate 20 and the side surface 65b of the protrusion 65. Therefore, even when using the panel 6 having the protrusion 65 having the side surface 65b that is an uneven surface, it is possible to reduce a gap that may be formed between the protrusion 65 and the base plate 20 and to improve the fixing strength between the base plate 20 and the panel 6. In addition, while the upper surface of the protrusion 65 is located at the same level as or lower than the bottom surface 235a of the protrusion placement portion 235 in the course of crimping, there is formed a space surrounded by the upper surface of the protrusion 65, the base plate 20, and the lower surface 91 of the panel protrusion pressurizing portion 90, the upper surface of the protrusion 65 being lower than the upper surface of the panel 6. As a result of simultaneously pressing both the base plate 20 and the protrusion 65, the base plate 20 is plastically deformed in such a way as to fill the space, so that the cover portion 237 is formed.

Here, a case where the base plate 20 is made of an aluminum material is taken as an example. The surface of the aluminum material is covered with an oxide film. When the oxide film on the surface of the aluminum material is peeled off, there appears a new surface covered with no oxide film. When the new surface of the aluminum material comes into contact with the panel 6, earthing resistance can be reduced. However, the new surface of the aluminum material is instantly covered with an oxide film when exposed to air.

Figure 6:
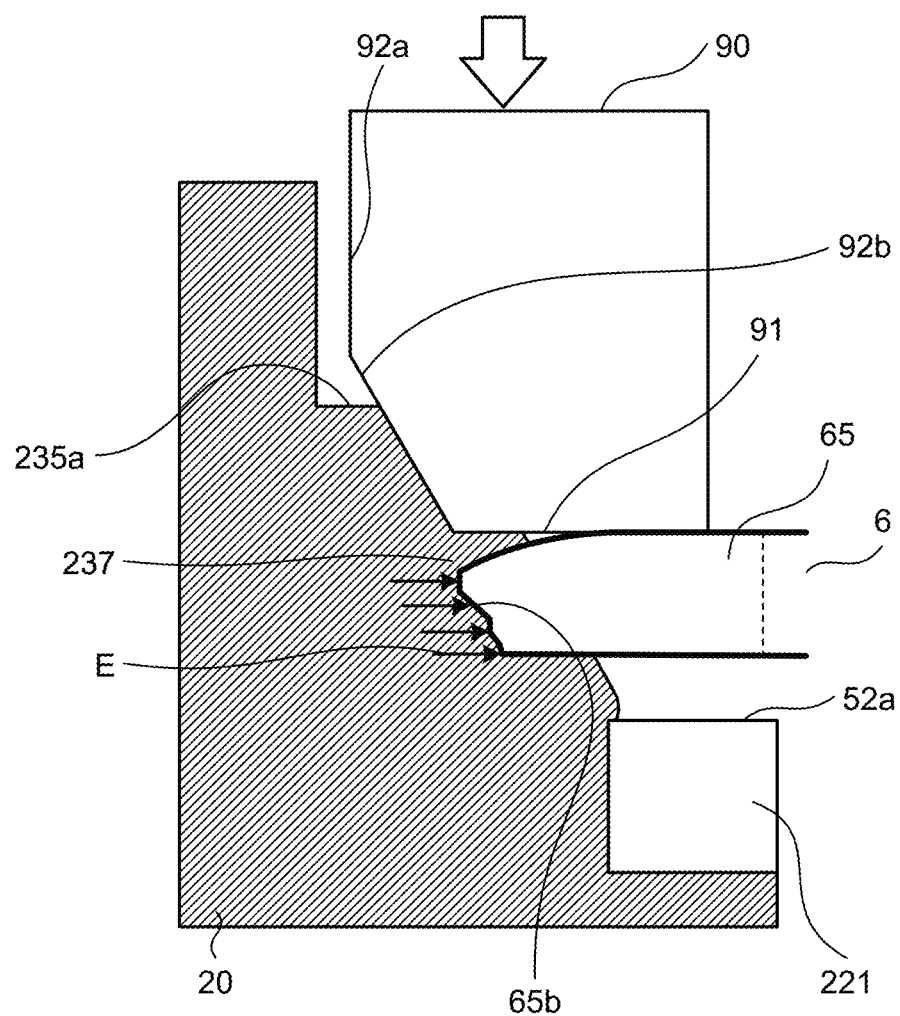
FIG. 6 is a cross-sectional view of the power semiconductor apparatus according to the first embodiment, which schematically shows the example of the procedure for the method for manufacturing the power semiconductor apparatus.

Therefore, in the present embodiment, as illustrated in FIG. 6, the protrusion 65 and the base plate 20 around the protrusion 65 are simultaneously pressed so as to deform the base plate 20 while keeping the side surface 65b of the protrusion 65 and the base plate 20 in close contact with each other. Thus, a gap between the side surface 65b of the protrusion 65 and the new surface of the base plate 20 can be filled with little air. At this time, it is allowable that a slight gap exists between the side surface 65b of the protrusion 65 and the base plate 20. That is, according to the manufacturing method of the present embodiment, a new surface appearing on the base plate 20 comes into contact with the protrusion 65 of the panel 6 before being oxidized. As a result, the earthing resistance can be reduced, and the power semiconductor apparatus 1 can be stably grounded.

Figure 7:
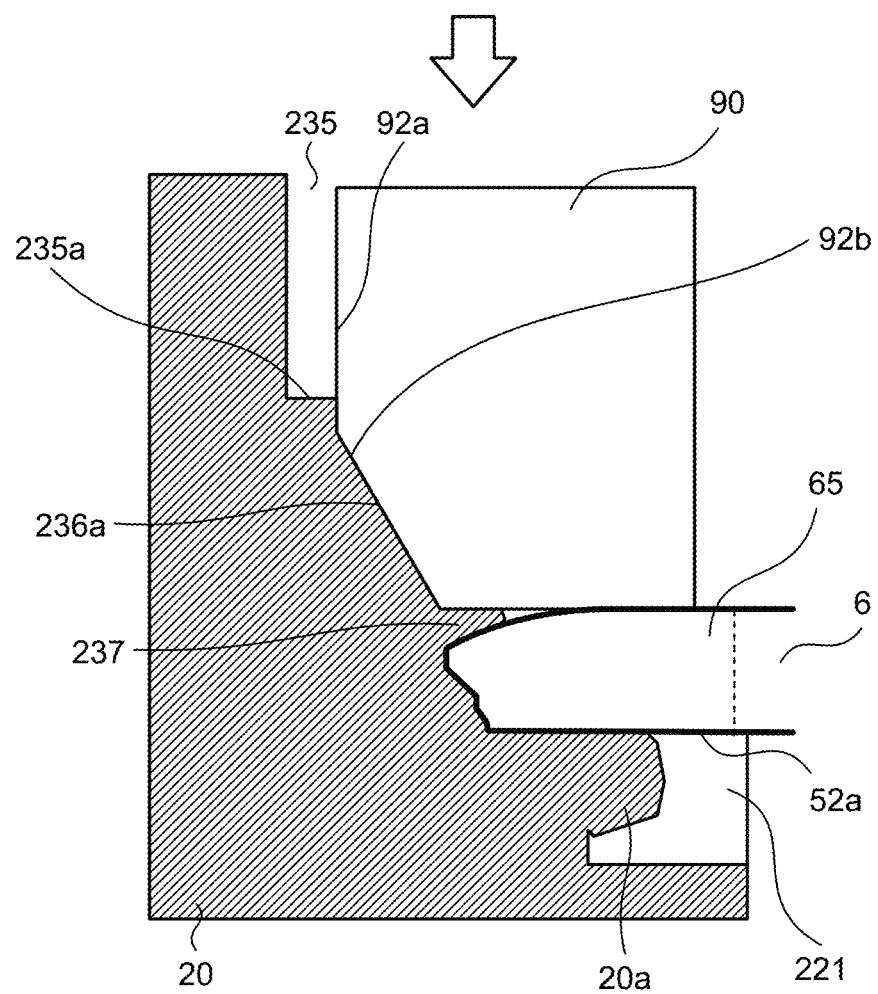
FIG. 7 is a cross-sectional view of the power semiconductor apparatus according to the first embodiment, which schematically shows the example of the procedure for the method for manufacturing the power semiconductor apparatus.

Then, as illustrated in FIG. 7, the lower surface of the panel 6 including the protrusion 65 reaches the panel installation surface 52a at the completion of crimping. Furthermore, when pressed by the panel protrusion pressurizing portion 90, a part of the base plate 20 is deformed and moved. As a result, base plate waste 20a which is a constituent material of the part of the base plate 20 moves to the waste clearance groove 221. A large space is ensured for the waste clearance groove 221, so that the base plate waste 20a can be discharged to the outside. Panel crimping is performed as described above.

As illustrated in FIGS. 5 to 7, panel crimping is completed in one step in which the protrusion 65 and the base plate 20 around the protrusion 65 are simultaneously pressed by use of the panel protrusion pressurizing portion 90. The panel protrusion pressurizing portion 90 has the lower surface 91 and side surfaces 92 and 92a. The lower surface 91 is a pressing surface that comes into contact with the protrusion 65. A lower portion of the side surface 92a which comes into contact with the base plate 20 at the time of pressing is cut off in a tapered shape. That is, the lower portion of the side surface 92a is tapered to form a tapered surface 92b such that the area of the panel protrusion pressurizing portion 90 parallel to the lower surface 91 decreases toward the lower surface 91. As described above, the panel protrusion pressurizing portion 90 is used which has the tapered surface 92b provided on the base plate 20 side. Accordingly, when the lower surface 91 of the panel protrusion pressurizing portion 90 presses the protrusion 65, a part of the panel protrusion pressurizing portion 90 enters the base plate 20 at an angle that is not perpendicular to the bottom surface 235a of the protrusion placement portion 235 of the base plate 20. As a result, when a part of material forming the base plate 20 is crushed by plastic deformation, the crushed part of the material is likely to move to the side surface 65b and upper surface of the protrusion 65.

When the panel protrusion pressurizing portion 90 is not provided with the tapered surface 92b, the side surface 92a of the panel protrusion pressurizing portion 90 and the base plate 20 remain in contact with each other until the panel protrusion pressurizing portion 90 is completely pulled out from the base plate 20. Therefore, in such a case, there is a problem in that the force of friction therebetween continues to be applied and thus, the panel protrusion pressurizing portion 90 is likely to be firmly fixed to the base plate 20. However, in the first embodiment, the panel protrusion pressurizing portion 90 is provided with the tapered surface 92b as illustrated in FIG. 7. Therefore, a contact interface between the tapered surface 92b of the panel protrusion pressurizing portion 90 and the base plate 20 serves as the tapered surface 236a after the panel crimping. Therefore, as soon as the panel protrusion pressurizing portion 90 is pulled up even slightly in a pull-out direction, that is, the upward direction in the example of FIG. 7, the tapered surface 92b of the panel protrusion pressurizing portion 90 comes out of contact with the tapered surface 236a of the base plate 20. As a result, the panel protrusion pressurizing portion 90 is easily detached from the base plate 20, and the panel protrusion pressurizing portion 90 is prevented from being firmly fixed to the base plate 20. Note that the bottom surface of the panel protrusion pressurizing portion 90 may have a rectangular shape, a perfect circular shape, an elliptical shape, or any other shape. Furthermore, it is desirable that the panel protrusion pressurizing portion 90 be made of material that is harder than the base plate 20 and the panel 6, such as stainless steel or tool steel.

Figure 8:
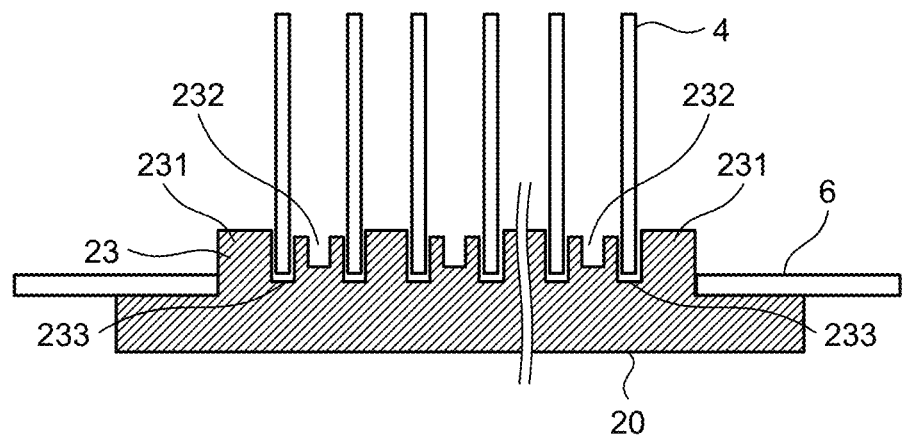
FIG. 8 is a cross-sectional view of the power semiconductor apparatus according to the first embodiment, which schematically shows the example of the procedure for the method for manufacturing the power semiconductor apparatus.
Figure 9:
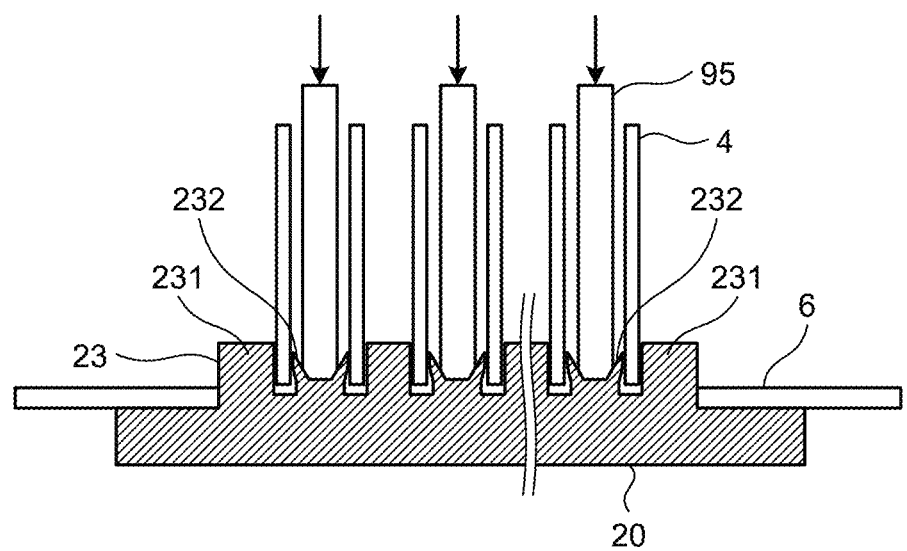
FIG. 9 is a cross-sectional view of the power semiconductor apparatus according to the first embodiment, which schematically shows the example of the procedure for the method for manufacturing the power semiconductor apparatus.

Thereafter, as illustrated in FIG. 8, the plurality of fins 4 is inserted into the fin insertion grooves 233 of the fin fixing portion 23. At this time, the lower portions of the fins 4 are in contact with the protruding wall portions 231. Furthermore, as illustrated in FIG. 9, a jig 95 is inserted into each crimp portion 232 between the fins 4, and pressure is applied. At this time, the jig 95 is inserted into the bifurcated portion of each crimp portion 232. As a result, the crimp portions 232 are plastically deformed, and the fins 4 are crimped and fixed onto the base plate 20. Then, the jig 95 is removed. Thus, the power semiconductor apparatus 1 is manufactured.

Figure 10:
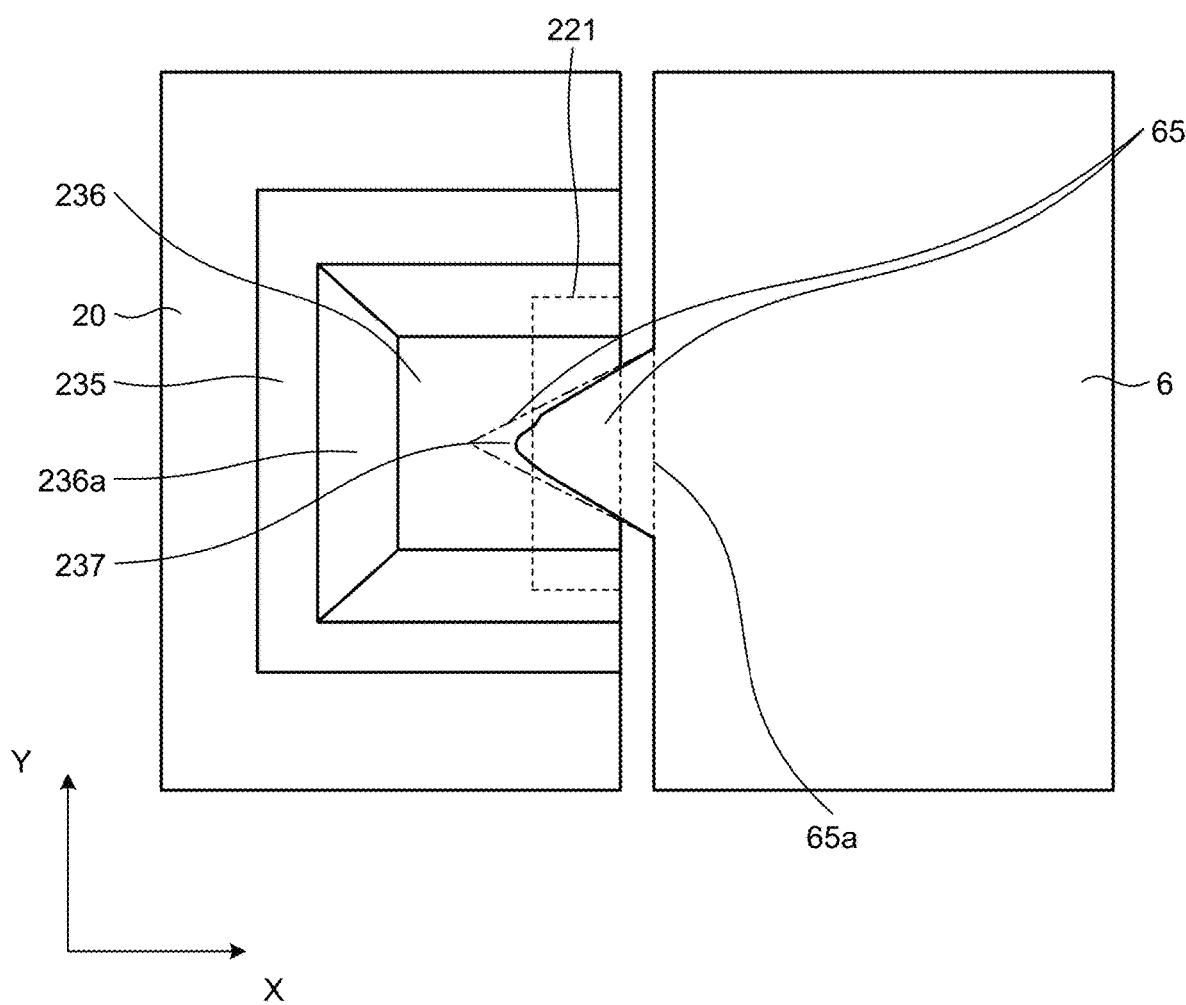
FIG. 10 is a top view of a fixing portion of a protrusion and the base plate, which schematically shows an example of the fixing portion where the protrusion has been fixed to the base plate as a result of a manufacturing process based on the method for manufacturing the power semiconductor apparatus according to the first embodiment.

FIG. 10 is a top view of a fixing portion of a protrusion and the base plate, which schematically shows an example of the fixing portion where the protrusion has been fixed to the base plate as a result of a manufacturing process based on the method for manufacturing the power semiconductor apparatus according to the first embodiment. After the panel protrusion pressurizing portion 90 applies pressure to perform panel crimping, the recess 236 is formed in the protrusion placement portion 235 of the base plate 20. The side surface of the protrusion placement portion 235 is perpendicular to the upper surface of the panel 6. Meanwhile, the side surface of the recess 236 is the tapered surface 236a inclined at an angle that is not perpendicular to the upper surface of the panel 6.

The recess 236 is larger than the protrusion 65 in a plan view. Thus, it is possible to move a large amount of the constituent material of the base plate 20 located around the protrusion 65 toward the protrusion 65 at the time of panel crimping. As a result, it is possible for the cover portion 237 of the base plate 20 to cover the upper surface of the end portion of the protrusion 65. Furthermore, the waste clearance groove 221 provided below the protrusion placement portion 235 is larger in width in the Y direction than the connecting portion 65a between the protrusion 65 and the panel 6. Thus, the base plate waste 20a generated by the movement of the constituent material of the base plate 20 easily spreads at the time of panel crimping, so that the base plate waste 20a is easily discharged to the outside of the base plate 20. As a result, the protrusion 65 can be efficiently pressed by the panel protrusion pressurizing portion 90, simultaneously with the base plate 20.

Incidentally, when the base plate 20 is pressed while being cut by the protrusion 65, there is a possibility that contact between the side surface 65b of the protrusion 65 and the base plate 20 may be reduced because the side surface 65b of the protrusion 65 formed by punching is an uneven surface. In addition, because the contact between the side surface 65b of the protrusion 65 and the base plate 20 is reduced, the panel 6 is likely to fall off in a direction opposite to the pressing direction. Therefore, there is a concern that a fault may occur. That is, the panel 6 may fall off when the manufacturing process proceeds to a next step after the panel 6 is fixed to the base plate 20.

Meanwhile, in the first embodiment, the fin fixing portion 23 of the base plate 20 is inserted into the opening 61 in the panel 6, and the panel 6 is fixed such that the lower surface of the panel 6 is in contact with the panel installation surface 52a of the base plate 20. The protrusion 65 is provided on an edge of the panel 6 on the opening 61 side. The protrusion 65 protrudes toward the opening 61, and the upper surface of the protrusion 65 is lower at its end than at the connecting portion 65a at which the protrusion 65 is connected with the panel 6. The cover portion 237 of the base plate 20 covers the upper surface of the protrusion 65 including the end thereof in a state where the panel 6 is fitted in the base plate 20 that is plastically deformed in such a way as to fill a gap between the side surface 65b on the end portion side of the protrusion 65 and the base plate 20. As a result, the fixing strength between the panel 6 and the base plate 20 is improved, so that the panel 6 can less likely to be detached from the base plate 20.

Note that it is conceivable that the side surface 65b of the protrusion 65, which is an uneven surface, is additionally processed by use of a method other than the method according to the first embodiment. Meanwhile, in the first embodiment, the protrusion 65 of the panel 6 and the base plate 20 are simultaneously pressed in one step to deform the base plate 20 and cause the constituent material of the base plate 20 to move to the side surface 65b and upper surface of the end portion of the protrusion 65, as described above. With this process, a part of the upper surface of the end portion of the protrusion 65 is covered with the base plate 20, and most of the gap between the side surface 65b of the protrusion 65 and the base plate 20 is filled. At this time, the side surface 65b of the protrusion 65 comes into contact with a new surface of the base plate 20 without being exposed to air. Therefore, it is possible to use the inexpensive panel 6 subjected only to punching, and it is also possible to reduce the earthing resistance and to stably ground the power semiconductor apparatus 1. In addition, radiation noise from the power semiconductor elements 11 is reduced, so that malfunction of the power semiconductor elements 11 can be significantly reduced.

Furthermore, the recess 236 having a side surface formed as the tapered surface 236a is provided below the protrusion placement portion 235 of the base plate 20. As a result, conditions of the completed panel crimping can be visually checked not only from above but also from an oblique direction, so that appearance inspection can be easily performed.

Second Embodiment

Figure 11:
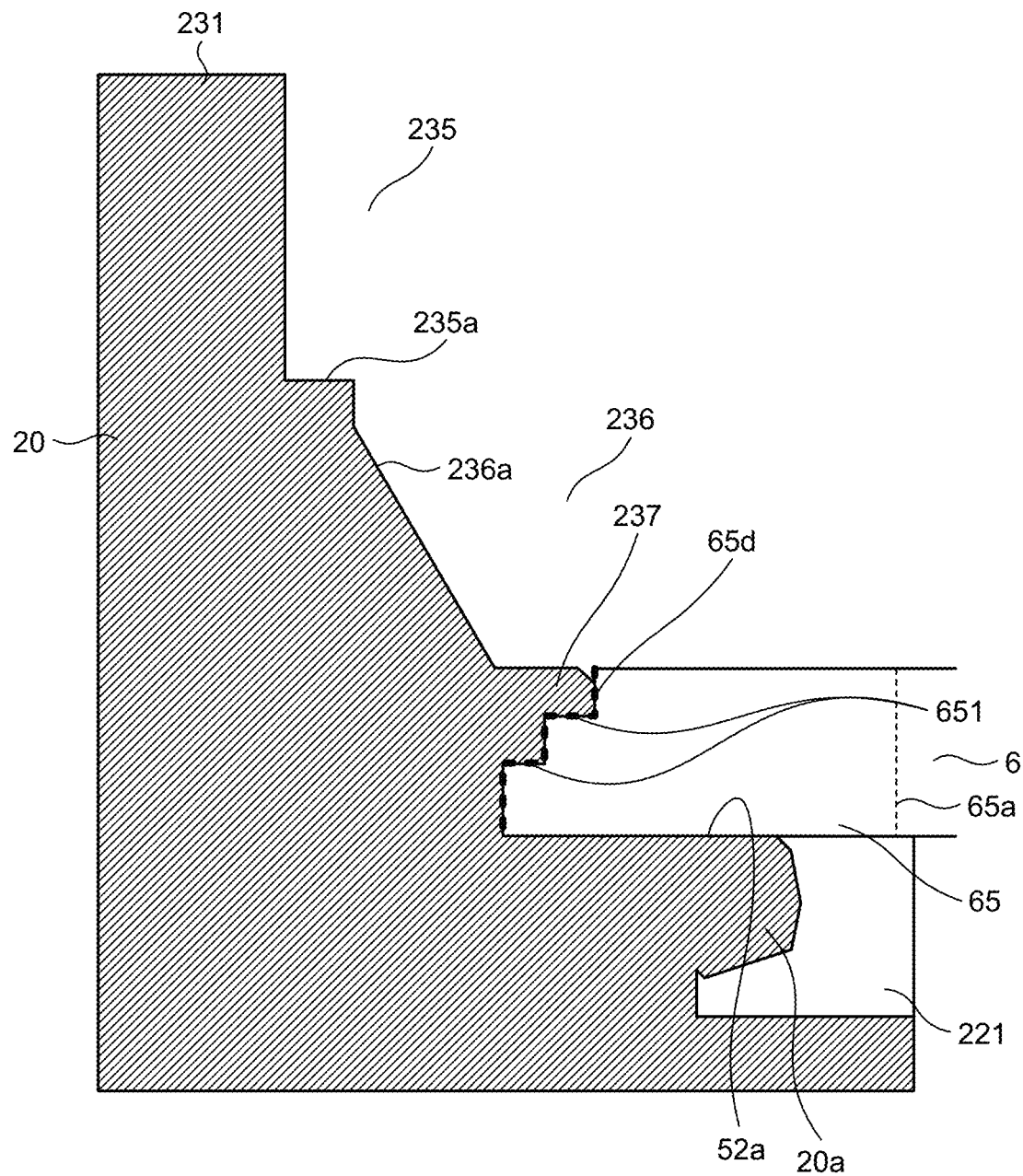
FIG. 11 is a schematic cross-sectional view of a portion where a base plate and a panel according to a second embodiment have been joined.

FIG. 11 is a schematic cross-sectional view of a portion where a base plate and a panel according to a second embodiment have been joined. In the second embodiment, the protrusion 65 has a step portion 65d where the level of the upper surface of the protrusion 65 decreases in a stepwise manner from the connecting portion 65a, at which the protrusion 65 is connected with the panel 6, toward the end of the protrusion 65. That is, the end portion of the protrusion 65 has a staircase structure. In the example of FIG. 11, the step portion 65d having three steps is illustrated, but the step portion 65d may have any number of steps. Then, each of flat portions 651 of the step portion 65d is covered with the cover portion 237 of the base plate 20. The step portion 65d just needs to be located on a side of the end of the protrusion 65 than the connecting portion 65a at which the protrusion 65 is connected with the panel 6. Furthermore, at least one or more of the plurality of protrusions 65 may be formed as the protrusion 65 illustrated in FIG. 11. Note that the same constituent elements as those in the first embodiment are denoted by the same reference numerals, and description thereof is omitted.

In the second embodiment, the protrusion 65 has the step portion 65d where the level of the upper surface of the protrusion 65 decreases in a stepwise manner from the connecting portion 65a, at which the protrusion 65 is connected with the panel 6, toward the end of the protrusion 65 in a side view. Furthermore, the cover portion 237 of the base plate 20 covers each flat portion 651 of the step portion 65d. As a result, effects similar to those of the first embodiment can be obtained. In addition, an increase in the angle of inclination of a virtual upper surface formed by the step portion(s) 65d increases the amount of the cover portion 237 covering the end portion of the protrusion 65 as compared with that in the first embodiment. Thus, it is possible to increase fixing strength between the base plate 20 and the panel 6 as compared with that in the first embodiment. In addition, because the end portion of the protrusion 65 is formed as the step portion(s) 65d, the area of contact between the protrusion 65 and the base plate 20 increases. As a result, the power semiconductor apparatus 1 can be stably grounded as in the first embodiment.

Third Embodiment

Figure 12:
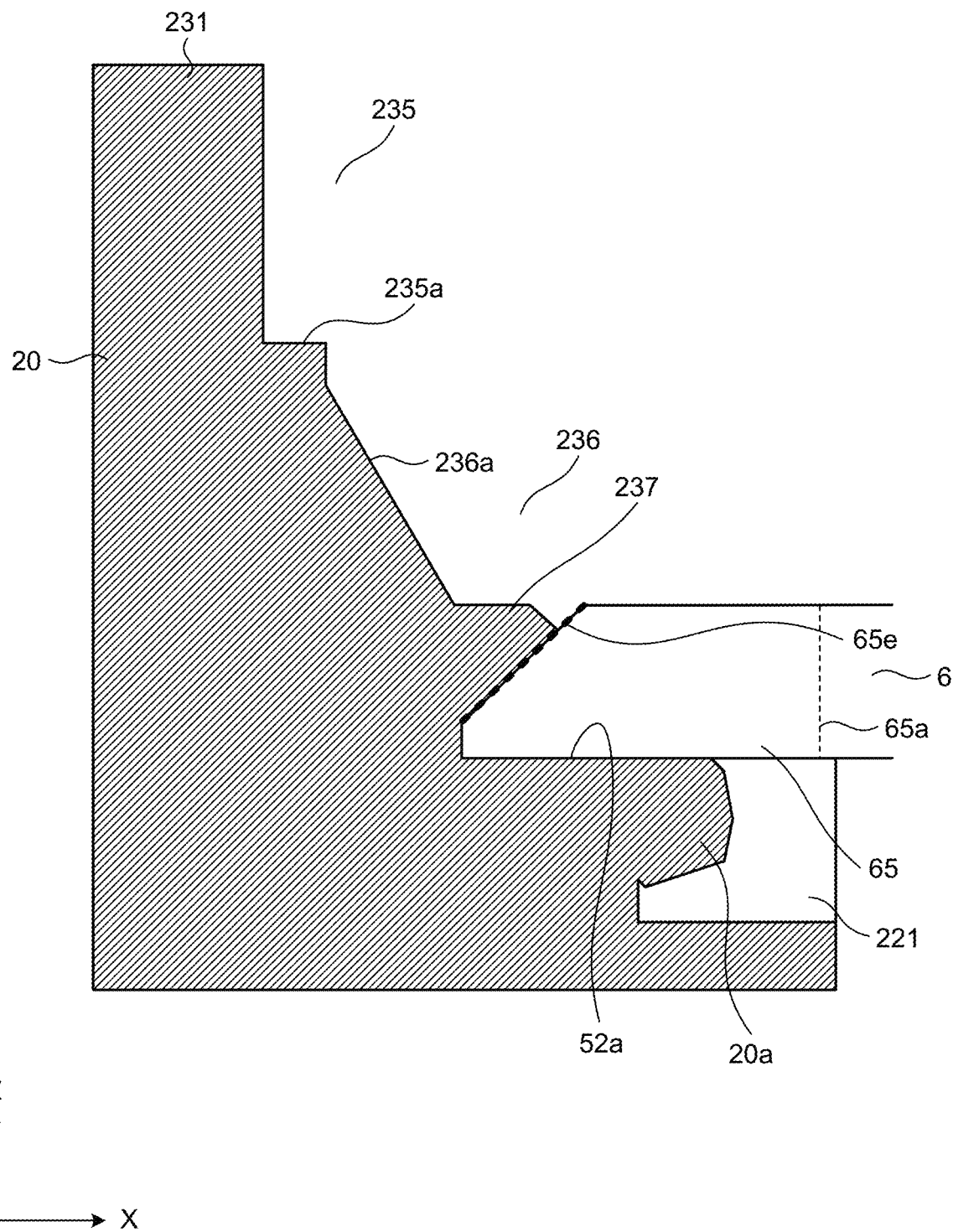
FIG. 12 is a schematic cross-sectional view of a portion where a base plate and a panel according to a third embodiment have been joined.

FIG. 12 is a schematic cross-sectional view of a portion where a base plate and a panel according to a third embodiment have been joined. In the third embodiment, the upper surface of the end portion of the protrusion 65 is formed as an inclined surface 65e having a linear gradient toward the end in the cross-sectional view. In addition, the inclined surface 65e is covered with the cover portion 237 of the base plate 20. In FIG. 12, the inclined surface 65e starts in the vicinity of the center of the protrusion 65 in its length direction. Meanwhile, the starting position of the inclined surface 65e just needs to be located on a side of the end of the protrusion 65 than the connecting portion 65a at which the protrusion 65 is connected with the panel 6. Furthermore, at least one or more of the plurality of protrusions 65 may each be formed as the protrusion 65 illustrated in FIG. 12. Note that the same constituent elements as those in the first embodiment are denoted by the same reference numerals, and description thereof is omitted.

In the third embodiment, the upper surface of the end portion of the protrusion 65 is formed as the inclined surface 65e having a linear gradient. Therefore, at the time of panel crimping, the constituent material of the base plate 20 fills a gap between the inclined surface 65e and the base plate 20 while moving. In addition, because the amount of the cover portion 237 covering the protrusion 65 with the base plate 20 increases as compared with that in the first embodiment, fixing strength between the base plate 20 and the panel 6 can be increased. Furthermore, because the area of contact between the protrusion 65 and the base plate 20 increases, the power semiconductor apparatus 1 can be stably grounded as in the first embodiment.

Fourth Embodiment

Figure 13:
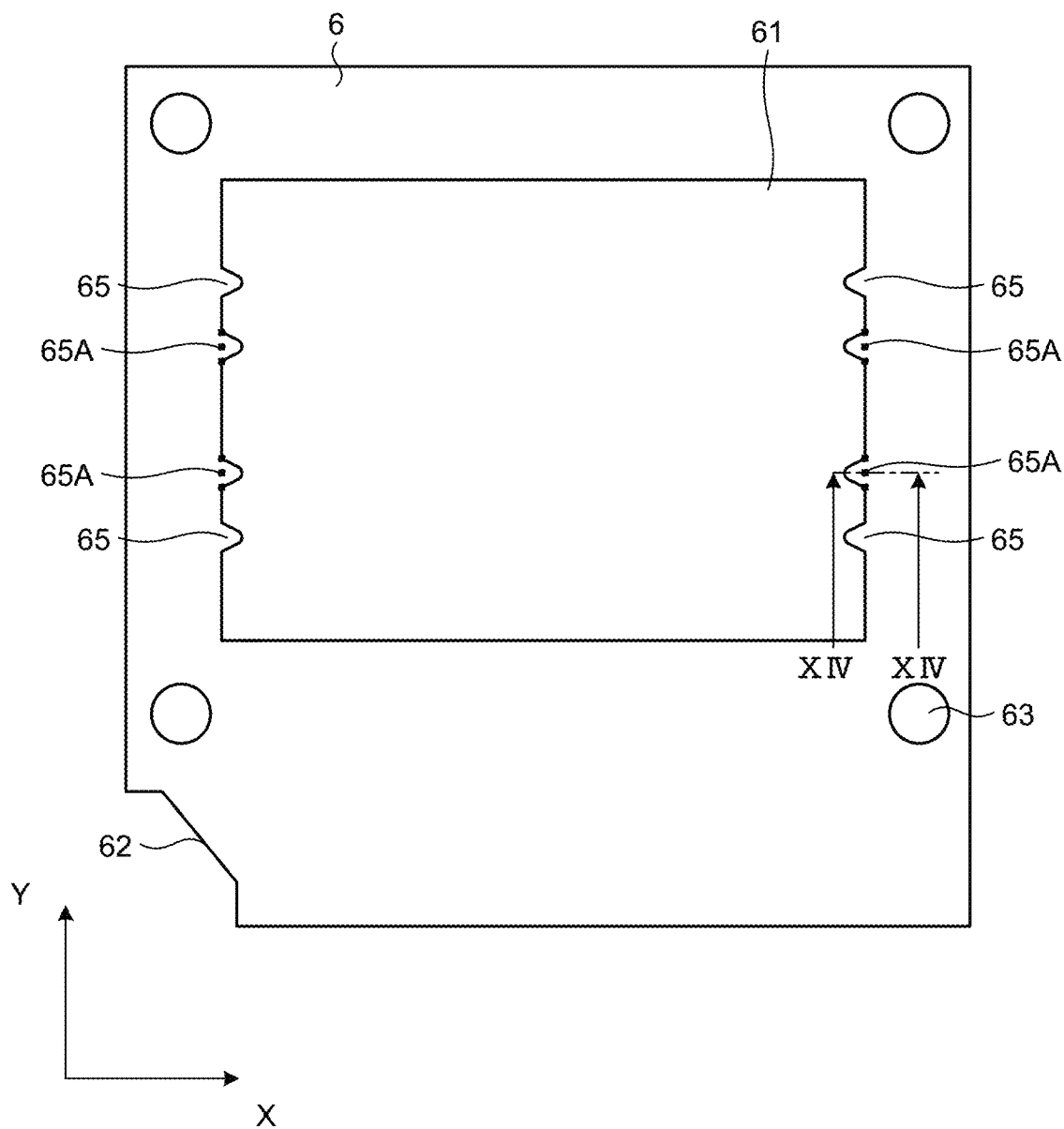
FIG. 13 is a top view of a panel according to a fourth embodiment, which schematically shows a configuration example of the panel.

FIG. 13 is a top view of a panel according to a fourth embodiment, which schematically shows a configuration example of the panel. The panel 6 has two types of protrusions 65 and 65A on side surfaces forming the opening 61. The protrusions 65 are provided on two of side surfaces forming the opening 61 in the panel 6 such that the protrusions 65 are each located on the outer side in the Y direction of the two side surfaces extending in the Y direction. In the example of FIG. 13, the protrusions 65 are arranged at four positions. The protrusions 65A are each disposed between the two protrusions 65 provided on each of the two of the side surfaces forming the opening 61 in the panel 6, the two side surfaces extending in the Y direction. In the example of FIG. 13, the protrusions 65A are arranged at four positions.

Figure 14:
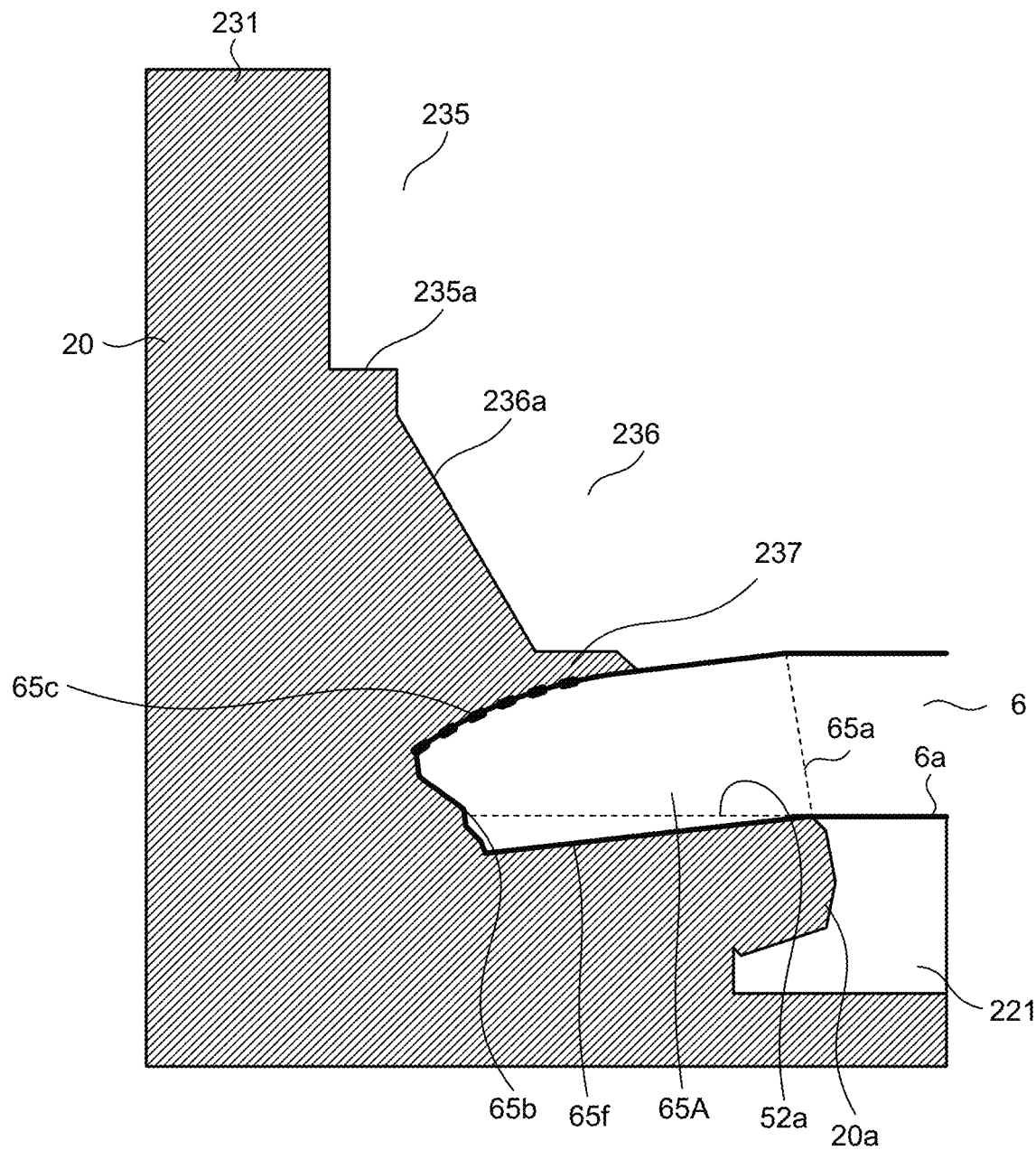
FIG. 14 is a cross-sectional view taken along line XIV-XIV in FIG. 13, which schematically illustrates a state of joining a base plate and the panel according to the fourth embodiment.

The protrusion 65 is the same as that described in FIG. 4 of the first embodiment, but the protrusion 65A has a structure different from that of the protrusion 65. FIG. 14 is a cross-sectional view taken along line XIV-XIV in FIG. 13, which schematically illustrates a state of joining a base plate and the panel according to the fourth embodiment. The protrusion 65A has a structure in which the protrusion 65A is bent downward from the connecting portion 65a at which the protrusion 65A is connected with the panel 6. In addition, a lower surface 65f defined as a sixth surface of the protrusion 65A is not located at the same level as a lower surface 6a of the panel 6. The lower surface 65f protrudes downward such that the lower surface 65f is positioned lower than the lower surface 6a of the panel 6. In the case of the panel 6 as illustrated in FIG. 13, the protrusion 65 and the protrusion 65A can be simultaneously formed by punching. That is, the panel 6 can be manufactured at low cost.

The lower surface of the protrusion 65 described in the first embodiment is flat, and easily comes into contact with the panel installation surface 52a. When the panel protrusion pressurizing portion 90 presses the protrusion 65, the protrusion 65 of the panel 6 reaches the panel installation surface 52a at which the panel crimping is completed. Therefore, the panel 6 is likely to be held by the base plate 20 without being inclined, as illustrated in FIG. 4. Meanwhile, the lower surface 65f of the protrusion 65A is disposed obliquely with respect to the lower surface 6a of the panel 6. With this configuration, as illustrated in FIG. 14, the protrusion 65A digs into the base plate 20 to a level lower than the panel installation surface 52a at which the panel crimping is completed.

Furthermore, the curved surface 65c of the end portion of the protrusion 65 is covered with the cover portion 237 of the base plate 20 as illustrated in FIG. 4. However, in the case of the protrusion 65A, an area wider than the curved surface 65c of the end portion is covered with the cover portion 237 of the base plate 20 as illustrated in FIG. 14. As a result, the area of contact between the protrusion 65A and the base plate 20 increases, so that fixing strength between the base plate 20 and the panel 6 increases. Note that the numbers of the protrusions 65 and the protrusions 65A have each been given as an example, and may be any numbers.

In the fourth embodiment, the panel 6 has the protrusion 65 and the protrusion 65A. The protrusion 65 has a lower surface located at the same level as the lower surface 6a of the panel 6. The protrusion 65A has the lower surface 65f protruding downward with respect to the lower surface 6a of the panel 6. The protrusion 65 has the function of maintaining the parallelism of the panel 6 subjected to panel crimping. In addition, the protrusion 65A has the function of reducing the inclination of the panel 6, and of increasing the fixing strength between the base plate 20 and the panel 6 by digging into the panel installation surface 52a of the base plate 20 at the time of panel crimping.

Furthermore, the area of a part of the upper surface of the protrusion 65A to be covered with the cover portion 237 of the base plate 20 increases as compared with that of the upper surface of the protrusion 65. This also increases the fixing strength between the base plate 20 and the panel 6.

Furthermore, the protrusion 65A disposed on the opening 61 side of the panel 6 digs into the panel installation surface 52a of the panel 6 in a state in which the protrusion 65A is bent downward from the connecting portion 65a at which the protrusion 65A is connected with the panel 6. As a result, the area of contact with the base plate 20 increases, and the power semiconductor apparatus 1 can be stably grounded.

Note that the shapes of the side surfaces of the protrusions 65 and 65A to be provided on the panel 6 are not limited to the shapes illustrated in FIGS. 4, 11, 12, and 14.

The configurations illustrated in the above embodiments show examples of the subject matter of the present invention, and it is possible to combine the configurations with another technique that is publicly known, and is also possible to make omissions and changes to part of the configurations without departing from the gist of the present invention.

REFERENCE SIGNS LIST 1 power semiconductor apparatus; 2 mold portion; 4 fin; 6 panel; 6a, 65f, 91 lower surface; 11 power semiconductor element; 12 lead frame; 14 conductive member; 15 connecting member; 16 insulating member; 18 molding resin; 20 base plate; 20a base plate waste; 21 first base; 22 second base; 23 fin fixing portion; 30 crimped heat sink; 51 first step portion; 51a, 651 flat portion; 52 second step portion; 52a panel installation surface; 61 opening; 65, 65A protrusion; 65a connecting portion; 65b, 92, 92a side surface; 65c curved surface; 65d step portion; 65e inclined surface; 90 panel protrusion pressurizing portion; 92b, 236a tapered surface; 95 jig; 121 element mounting portion; 122 terminal portion; 221 waste clearance groove; 231 protruding wall portion; 232 crimp portion; 233 fin insertion groove; 235 protrusion placement portion; 235a bottom surface; 236 recess; 237 cover portion.

The invention claimed is:

1. A power semiconductor apparatus comprising:
a mold portion that includes a power semiconductor element and a base plate which are molded in molding resin, the base plate having a first surface and a second surface, a plurality of grooves being arranged on the first surface, the second surface being on a side opposite to the first surface in a Z direction perpendicular to the first surface;
a panel that is conductive and has a flat plate shape, and has an opening into which the first surface of the base plate is inserted, the panel having a third surface and a fourth surface that is on a side opposite to the third surface; and
a plurality of fins fixed in the grooves of the base plate, wherein
the panel has a plurality of protrusions on side surfaces forming the opening, each protrusion protruding, from one of the side surfaces on which the protrusion is provided, toward another of the side surfaces facing the one side surface,
each protrusion has a fifth surface, a cross section of which has a shape that tapers down toward an end of the protrusion, the cross section being parallel to a plane extending in the Z direction and a direction in which the protrusion protrudes, and the base plate has cover portions covering the fifth surfaces of the plurality of protrusions including the ends of the protrusions, and is plastically deformed to allow the panel to be fitted in the base plate to fill gaps between side surfaces of the plurality of protrusions and the base plate,
upper surfaces of the cover portions are located at same levels as or lower than highest positions of the fifth surfaces of the protrusions in the Z direction.

2. The power semiconductor apparatus according to claim 1, wherein an end portion of the fifth surface of each of the plurality of protrusions is a curved surface.

3. The power semiconductor apparatus according to claim 1, wherein an end portion of the fifth surface of at least one of the plurality of protrusions has a step portion.

4. The power semiconductor apparatus according to claim 1, wherein an end portion of the fifth surface of at least one of the plurality of protrusions is an inclined surface having a linear gradient.

5. The power semiconductor apparatus according to claim 1, wherein
the base plate has a panel installation surface on which the panel is placed, at a position where the panel is fixed, and
each of the plurality of protrusions is placed such that a sixth surface is in contact with the panel installation surface, the sixth surface being on a side opposite to the fifth surface.

6. The power semiconductor apparatus according to claim 1, wherein
the base plate has a panel installation surface on which the panel is placed, at a position where the panel is fixed,
the plurality of protrusions includes a first protrusion and a second protrusion, a sixth surface of the first protrusion being located at a same level as the fourth surface of the panel in the Z direction, an end of the sixth surface of the second protrusion being located on a side opposite to the third surface with respect to the fourth surface of the panel, the sixth surface being on a side opposite to the fifth surface,
the first protrusion is placed such that the sixth surface is in contact with the panel installation surface, and
at least a part of the second protrusion digs into the panel installation surface.

7. The power semiconductor apparatus according to claim 1, wherein
the base plate has a recess between the cover portion and the first surface in the Z direction, and
a side surface of the recess has a tapered shape.

8. The power semiconductor apparatus according to claim 5, wherein the base plate has a groove between the panel installation surface and the second surface in the Z direction.

9. The power semiconductor apparatus according to claim 1, wherein a material that forms the base plate is softer than a material that forms the panel.

10. A method for manufacturing a power semiconductor apparatus, comprising:
forming a mold portion that includes a power semiconductor element and a base plate which are molded in molding resin, the base plate having a first surface and a second surface, a plurality of fins being fixed on the first surface, the second surface being on a side opposite to the first surface in a Z direction perpendicular to the first surface;
inserting the first surface of the base plate into an opening in a panel having a plurality of protrusions such that the plurality of protrusions of the panel is placed on the base plate, the panel being conductive and in a flat plate shape, each of the protrusions protruding from one of side surfaces on which the protrusion is provided toward another of the side surfaces facing the one side surface, the side surfaces forming the opening, the panel having a third surface and a fourth surface that is on a side opposite to the third surface; and first pressing the plurality of protrusions with respect to the first surface of the base plate in the Z direction by using a jig, and pressing the plurality of protrusions and the first surface of the base plate in the Z direction after the jig comes into contact with the protrusions and the base plate, wherein each protrusion has a fifth surface a cross section of which has a shape that tapers down toward an end of the protrusion, the cross section being parallel to a plane extending in the Z direction and a direction in which the protrusion protrudes.

11. The method for manufacturing a power semiconductor apparatus, according to claim 10, wherein the jig has a pressing surface and a side surface, the pressing surface coming into contact with the protrusion and the base plate, the pressing surface being parallel to the first surface of the base plate, the side surface being adjacent to the pressing surface, and a part of the side surface is tapered such that an area of the jig parallel to the pressing surface decreases toward the pressing surface, the part of the side surface coming into contact with the base plate at a time of pressing.

12. A power semiconductor apparatus comprising:

a mold portion that includes a power semiconductor element and a base plate which are molded in molding resin, the base plate having a first surface and a second surface, a plurality of grooves being arranged on the first surface, the second surface being on a side opposite to the first surface in a Z direction perpendicular to the first surface;

a panel that is conductive and has a flat plate shape, and has an opening into which the first surface of the base plate is inserted, the panel having a third surface and a fourth surface that is on a side opposite to the third surface; and a plurality of fins fixed in the grooves of the base plate, wherein the panel has a plurality of protrusions on side surfaces forming the opening, each protrusion protruding, from one of the side surfaces on which the protrusion is provided, toward another of the side surfaces facing the one side surface, each protrusion has a fifth surface, a cross section of which has a shape that tapers down toward an end of the protrusion, the cross section being parallel to a plane extending in the Z direction and a direction in which the protrusion protrudes, and the base plate has cover portions covering the fifth surfaces of the plurality of protrusions including the ends of the protrusions, and has recesses formed between the cover portions and the first surface in the Z direction, and is plastically deformed to allow the panel to be fitted in the base plate to fill gaps between side surfaces of the plurality of protrusions and the base plate, and a side surface of each of the recesses has a tapered shape.

13. The power semiconductor apparatus according to claim 12, wherein an end portion of the fifth surface of each of the plurality of protrusions is a curved surface.

14. The power semiconductor apparatus according to claim 12, wherein an end portion of the fifth surface of at least one of the plurality of protrusions has a step portion.

15. The power semiconductor apparatus according to claim 12, wherein an end portion of the fifth surface of at least one of the plurality of protrusions is an inclined surface having a linear gradient.

16. The power semiconductor apparatus according to claim 12, wherein the base plate has a panel installation surface on which the panel is placed, at a position where the panel is fixed, and each of the plurality of protrusions is placed such that a sixth surface is in contact with the panel installation surface, the sixth surface being on a side opposite to the fifth surface.

17. The power semiconductor apparatus according to claim 12, wherein the base plate has a panel installation surface on which the panel is placed, at a position where the panel is fixed, the plurality of protrusions includes a first protrusion and a second protrusion, a sixth surface of the first protrusion being located at a same level as the fourth surface of the panel in the Z direction, an end of the sixth surface of the second protrusion being located on a side opposite to the third surface with respect to the fourth surface of the panel, the sixth surface being on a side opposite to the fifth surface, the first protrusion is placed such that the sixth surface is in contact with the panel installation surface, and at least a part of the second protrusion digs into the panel installation surface.

18. The power semiconductor apparatus according to claim 16, wherein the base plate has a groove between the panel installation surface and the second surface in the Z direction.

19. The power semiconductor apparatus according to claim 6, wherein the base plate has a groove between the panel installation surface and the second surface in the Z direction.

20. The power semiconductor apparatus according to claim 17, wherein the base plate has a groove between the panel installation surface and the second surface in the Z direction.

21. The power semiconductor apparatus according to claim 12, wherein a material that forms the base plate is softer than a material that forms the panel.

* * * * *